US012756480B2

(12) United States Patent
Gamble et al.

(10) Patent No.: US 12,756,480 B2
(45) Date of Patent: Oct. 6, 2026

(54) HYBRID QUANTUM-CLASSICAL COMMUNICATION SYSTEM

(71) Applicant: General Dynamics Mission Systems, Inc., Fairfax, VA (US)

(72) Inventors: Claudia Ann Gamble, Annapolis, MD (US); Juan C. Juarez, Ellicott City, MD (US); Todd M.W. Hodges, Mesa, AZ (US); John Anthony Gariano, Chandler, AZ (US); John M. Liebetreu, Scottsdale, AZ (US); Jerry Kwa-Wor Tong, chandler, AZ (US)

(73) Assignee: GENERAL DYNAMICS MISSION SYSTEMS, INC., Fairfax, VA (US)

( * ) Notice: Subject to any disclaimer, the term of this patent is extended or adjusted under 35 U.S.C. 154(b) by 175 days.

(21) Appl. No.: 18/754,411

(22) Filed: Jun. 26, 2024

(65) Prior Publication Data

US 2026/0005772 A1 Jan. 1, 2026

(51) Int. Cl.
*H04B 10/70* (2013.01)
*B82Y 20/00* (2011.01)
*H01S 5/026* (2006.01)

(52) U.S. Cl.
CPC .............. *H04B 10/70* (2013.01); *B82Y 20/00* (2013.01); *H01S 5/0265* (2013.01)

(58) Field of Classification Search
CPC ........ H04B 10/70; H01S 5/0265; B82Y 20/00
USPC .......................................................... 398/140
See application file for complete search history.

(56) References Cited

U.S. PATENT DOCUMENTS

| | | | | |
|---|---|---|---|---|
| 10,992,391 | B1 * | 4/2021 | Meyers | H04B 10/0799 |
| 2014/0119729 | A1 * | 5/2014 | Brodsky | H04Q 11/0005 398/48 |
| 2024/0072907 | A1 * | 2/2024 | Qi | H04B 10/70 |
| 2025/0047385 | A1 * | 2/2025 | Woodward | H04B 10/2581 |
| 2025/0165827 | A1 * | 5/2025 | Gurses | G06N 10/20 |
| 2026/0005771 | A1 * | 1/2026 | Gariano | H04B 10/70 |

(Continued)

FOREIGN PATENT DOCUMENTS

| | | | | |
|---|---|---|---|---|
| WO | WO-2020200449 A1 * | 10/2020 | | H04B 10/70 |
| WO | WO-2020211950 A1 * | 10/2020 | | H04L 9/0852 |

OTHER PUBLICATIONS

Tabi et al; Hybrid Quantum-Classical Autoencoders for End-to-End Radio Communication ;2022; IEEE/ACM 7th Symposium on Edge Computing; pp. 1-7. (Year: 2022).*

(Continued)

*Primary Examiner* — Amritbir K Sandhu
(74) *Attorney, Agent, or Firm* — Ingrassia Fisher & Lorenz, LLP

(57) ABSTRACT

The classical channel employs a transmit laser and classical modulator. The quantum channel employs a nonlinear medium and spontaneous parametric down conversion producing quantum entangled signal and idler photon pairs which are encoded. The classical and quantum channels are combined to define a propagated hybrid signal. The receiver splits the hybrid signal on basis of wavelength into classical and quantum channels. The quantum receiver employs optical parametric amplification, supplied with energy from a second harmonic generation device synchronized to the classical carrier wavelength. A photodetector and extracts a quantum message from the quantum signal.

20 Claims, 1 Drawing Sheet

(56) References Cited

U.S. PATENT DOCUMENTS

2026/0005772 A1 * 1/2026 Gariano ................ H04B 10/70

OTHER PUBLICATIONS

Shaik et al; Hybrid Quantum-Classical Approaches to Optimize Signal Processing in Massive MIMO Arrays; 2024; International Conference on Communication, Computer Sciences and Engineering; pp. 1-6. (Year: 2024).*

Long et al; Hybrid quantum-classical-quantum convolutional neural networks ;2025, nature.com, pp. 1-17. (Year: 2025).*

* cited by examiner

HYBRID QUANTUM-CLASSICAL COMMUNICATION SYSTEM

TECHNICAL FIELD

The disclosure relates generally to communication systems supporting both classical and quantum encoding. More particularly the disclosure relates to a hybrid classical-quantum communication system that enables secure quantum communications that are spectrally multiplexed with classical channels for propagation via fiber and free-space optical links.

BACKGROUND

This section provides background information related to the present disclosure which is not necessarily prior art.

Classical communications systems in widespread use today are capable of high data rates needed for sophisticated digital messaging. However, classical systems are not very secure. A classically encoded message can readily be received by a third party without the knowledge of the communicating parties. Quantum communication offers a key advantage of enhanced security. Security is afforded because the quantum-entangled states carrying the quantum-encoded message are destroyed in the act of reading the message, thus revealing that the message has been intercepted and tampered with. However, currently realizable systems are limited to low data rates compared to classical systems.

Some have proposed utilizing a combination of classical and quantum communication in quantum key distribution systems (QKD). Such systems require concurrent communication between both classical and quantum channels to distribute the quantum key. This requirement arises from the no-cloning theorem of quantum mechanics, which states that it is impossible to create an independent and identical copy of an arbitrary unknown quantum state. Thus the classical channel must be used to avoid reading and thereby destroying the quantum-encoded information.

While QKD represents a promising way to transfer keys needed for encryption system, the technique is not ideal for general purpose communication. Because the classical channel is required to support the quantum key exchange, users of the QKD system are not free to transfer data over either channel independently and thus cannot distribute information across both classical and quantum channels.

SUMMARY

The disclosed hybrid system establishes a classical channel and a quantum channel carried in parallel by the same optical signal transmission. The quantum channel operates at a wavelength that is generated from the transmit laser of the classical channel. The optical transmission may be propagated in free space or via an optical waveguide. The quantum channel is centered around the wavelength of the classical channel. In this way, the disclosed hybrid system may take advantage of the high data rate of a classical channel while enjoying the extra security of a quantum channel.

At the receiver, the optical stream is split so that its respective classical and quantum channels can be decoded separately. The quantum channel decoder employs optical parametric amplification to boost the otherwise weak quantum signal. To ensure that the quantum signal and classical signal are in synchronism, optical injection locking extracts the principal carrier from the received classical signal, followed by a second harmonic generation process to finally generate the receiver pump photon stream.

In one aspect, a hybrid quantum-classical communication system is disclosed which includes a transmitter and a receiver having a classical channel and quantum channel.

Transmitter

The classical channel employs a transmit laser producing light of first wavelength and a classical modulator producing classical signal of the first wavelength.

The quantum channel employs a first nonlinear medium coupled to receive light from the transmit laser and producing a first stream of photons of a wavelength half that of the first wavelength. A second nonlinear medium receptive of the stream of photons from the first nonlinear medium and producing through spontaneous parametric down conversion second stream of quantum entangled signal and idler photon pairs. An encoder receptive of the signal and idler photon pairs that places a quantum signal on the signal and idler photon pairs to define a quantum signal at a signal wavelength and an idler wavelength, each different from the first wavelength A combiner receptive of the classical signal and the quantum signal that combines the classical and quantum signals into a propagated hybrid signal that occupies an optical spectrum that covers the first wavelength of the classical signal and the signal and idler wavelengths of the quantum signal.

Receiver

The receiver input is receptive of the propagated hybrid signal. A splitter coupled to the receiver input that splits the propagated signal on the basis of wavelength into a classical channel and a quantum channel. A classical receiver, coupled to the classical channel, demodulates the classical signal to extract a classical message. A quantum receiver coupled to the splitter for extracting a quantum message from the quantum signal.

The quantum receiver has an optical parametric amplifier that boosts the intensity of the quantum signal by increasing the number of signal and idler photons to produce an amplified stream of signal and idler photons. The optical parametric amplifier is supplied with optical energy to support optical parametric amplification from a second harmonic generation device receptive of the optical energy synchronized to the first wavelength.

A photodetector, coupled to receive the amplified stream of signal and idler photons, produces an electrical signal supplied to a demodulator that extracts a quantum message from the quantum signal.

BRIEF DESCRIPTION OF THE DRAWINGS

The drawings described herein are for illustrative purposes only of selected embodiments and not all possible implementations. The particular choice of drawings is not intended to limit the scope of the present disclosure.

DETAILED DESCRIPTION

The disclosed hybrid quantum-classical communication system is an optical system employing optical energy (i.e., electromagnetic energy) carried by photons. According to quantum theory, photons exhibit both wave-like and particle-like properties (the so-called wave-particle duality). Photons of a given energy have a given wavelength. The higher the energy, the shorter the wavelength. This relationship is expressed by Planck's radiation law:

$$E = hv - \text{where } E \text{ is energy, } v \text{ is frequency and } h \text{ is Planck's constant.}$$

The term frequency is a popularly used to describe how transceiver-receiver systems are tuned. However, in optical systems, wavelength is often the more convenient term, as it more closely relates to the geometric properties of the lasers, waveguides and radiating apertures that produce the propagating signals. Therefore, wavelength will be used in this disclosure. Wavelength 1 and frequency v are reciprocally interchangeable based on the speed of light:

$$\lambda = \frac{c}{v} - \text{where } c \text{ is the speed of light and } v \text{ is frequency}$$

In the disclosed embodiment the system is based on photons at wavelengths of 1560 nm and 780 nm. Other wavelengths may be used. According to the equations above, the longer wavelength (1560 nm) has lower energy than the shorter wavelength (780 nm).

Hybrid Classical-Quantum System Components

Figure 1:
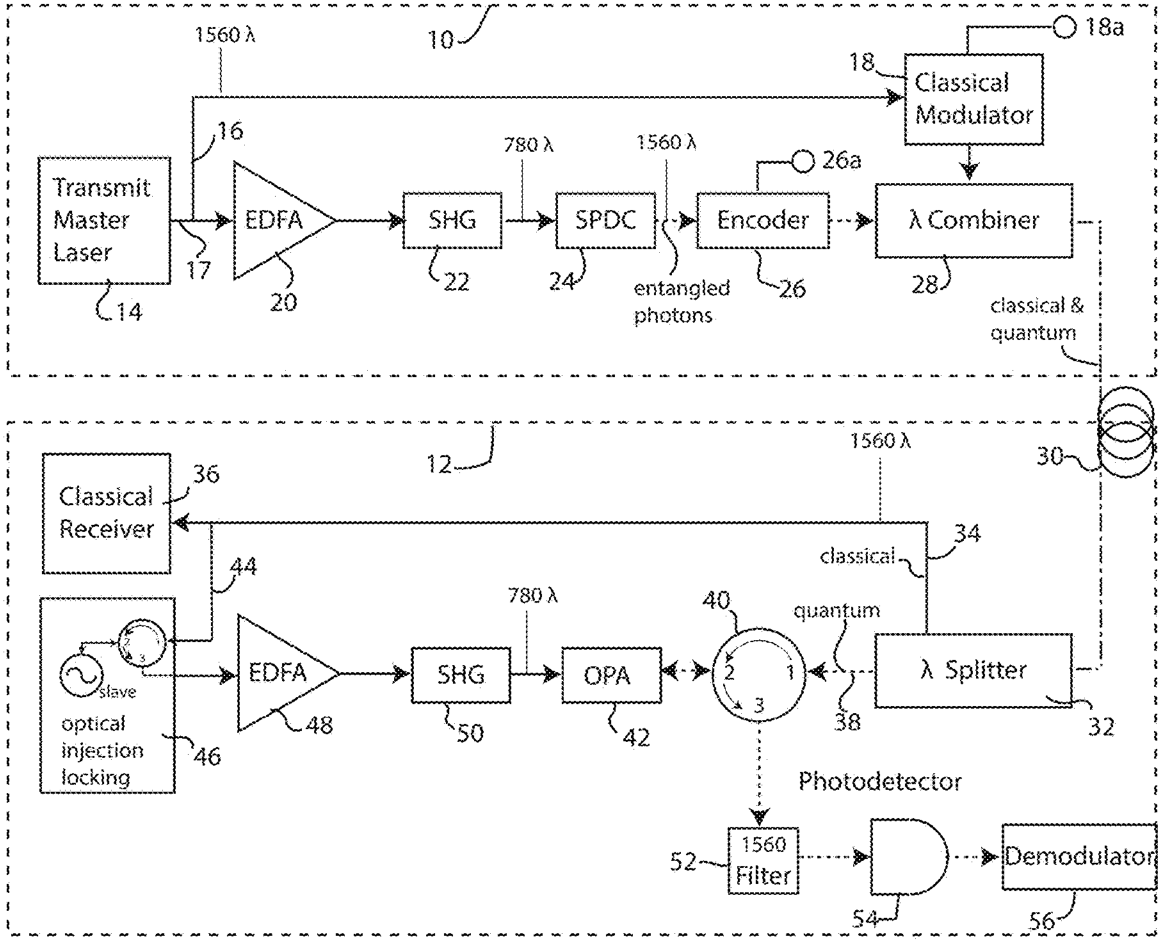
FIG. 1 is a block diagram of an embodiment of the hybrid quantum-classical system.

Referring to FIG. 1, a complete hybrid classical-quantum communication system is shown as comprising a transmitter 10 and receiver 12, both shown in dashed lines. Each of the transmitter and receiver components supports a classical channel and a quantum channel.

Transmitter

Classical channel transmitter: The transmitter employs a transmit master laser 14, which outputs a stream of photons at a nominal wavelength of 1560 nm. The 1560 nm photon stream is split, thus supplying photons for the classical channel via waveguide 16 and photons for the quantum channel via waveguide 17. The classical channel waveguide 16 is fed to the classical modulator 18, which modulates the photon stream based on an encoding message supplied to the modulator control input 18*a*. Any suitable classical modulation scheme may be used for the classical channel.

Quantum channel transmitter: The quantum channel waveguide 17 passes the transmit master laser energy through an amplifier, such as an erbium-doped fiber amplifier (EDFA), which is suitable for wavelengths between 1525 nm to 1565 nm. This amplifier effectively boosts the optical intensity of the photon stream split off from the classical transmit master laser 14. The EDFA supplies its amplified output to a waveguide containing a nonlinear medium which receives the 1525 nm photons and produces higher energy 780 nm photons by a process known as second harmonic generation (SHG).

Second Harmonic Generation

The spontaneous harmonic generation (SHG) process involves passing photons through a nonlinear medium such as a nonlinear crystal, which produces higher energy photons. Thus the SHG process when supplied with a stream of 1560 nm photons will generate a higher energy stream of 780 nm photons which are added to the stream. The 1560 nm photons used in generating the 780 nm photons are annihilated in the process.

In effect the SGH process 22 converts the transmit master laser's pump wavelength to a higher energy pump wavelength (780 nm) which is needed for the spontaneous parametric down conversion (SPDC) discussed below. As compared with the EDFA process, which increases intensity (the number of photons), the SHG process increases the energy of the photons (generating photons of shorter wavelength).

Figure 2:
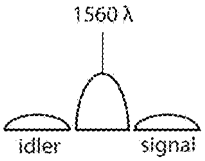
FIG. 2 is a spectral diagram of the spectrally multiplexed classical and quantum signals, illustrating how the signal and idler quantum signals are offset on opposite sides of the classical signal.

The output of SHG 22 is supplied to the spontaneous parametric down conversion (SPDC) component 24. This component employs a nonlinear material which produces entangled photons. Specifically high energy photons from the SHG 22 are annihilated, producing pairs of entangled lower energy photons. These entangled pairs are respectively termed signal and idler photons. The sum of the signal and idler photon energies is equal to the pump photon energy. Thus the signal and idler photons have wavelengths of nominally 1560 nm. More specifically, as illustrated in FIG. 2, the signal and idler photons occupy wavelengths on opposite sides of the classical pump laser wavelength. This spectral distribution is a natural byproduct of the SPDC process.

The SPDC process produces a stream of entangled signal and idler photon pairs, but the process is not 100% efficient. From a subatomic perspective, the atoms comprising the non-linear crystal are quite spaced apart relative to a passing pump photon. Thus many pump photons pass through the crystal unchanged. However, a relatively small percentage of photons will collide with an atom of the crystal. Such collision annihilates the pump photon and creates two lower energy photons. Thus some of the high energy photons from the SHG 22 may still exist in the photon stream output of the SPDC 24. These higher energy photons may be removed inserting a suitable optical filter in the stream that passes the 1560 nm signal and idler photons and blocks the 780 nm photons.

Physics of Spontaneous Parametric Down Conversion (SPDC)

Creation or annihilation of photons is a fundamental way that the electromagnetic field exchanges energy with matter. A photon can be destroyed, promoting an electron in an atom from one energy state to another, provided that the energy difference between the initial and final states is equal to the energy of the photon. The promoted electron thereafter falls to a lower energy state(s) within the atom, creating photon(s) in the process.

Spontaneous parametric down-conversion is a quantum process. It cannot be described by classical Maxwell's equations because it involves interactions with the vacuum state, where classically speaking, the electric field is zero. Moreover, being a quantum process, the times at which the two resulting photons are created are very strictly controlled by quantum physics, as follows.

A photon can be considered a particle with energy $E=\hbar\omega$ and momentum $p=\hbar k$. When such photon is annihilated, two photons are created in its place, having energies $E=\hbar\omega_1$ and $E=\hbar\omega_2$, where $\hbar\omega=\hbar\omega_1+\hbar\omega_2$, conserving energy. Similarly $\hbar k=\hbar k_1+\hbar k_2$, conserving momentum. This means that the two lower energy photons are created in pairs substantially simultaneously (i.e., within a time interval less than $1/\omega_3$ from the annihilation of the higher energy photon in order to conserve energy.)

By virtue of the spontaneous parametric down-conversion event, the pair of photons produced are time-energy entangled. There is a correlation between the wavelength of one photon and the time of arrival of the other.

From a layman's point of view, the two resulting photons can be thought of as having been created at essentially the same instant—and this is true with every such creation event. The process is highly repeatable and requires no human intervention. This precise timing becomes important when we consider the encoding process discussed below.

Having been created by the same quantum event, these photons share several important quantum properties and are said to be entangled. By convention, one of the entangled photons is called the signal and the other the idler.

One of these properties shared by the entangled photon pair is the specific wavelength or frequency relationship which results from the conservation of energy and momentum discussed above. As illustrated in FIG. 2 discussed below, the wavelength relationships of each entangled photon pair allow them to be channelized based on wavelength along with the classical carrier wavelength.

Quantum Encoder

The signal and idler photons from SPDC 24 are next fed to the encoder 26, which encodes the entangled photons with the quantum message. While several encoding techniques are possible, one technique involves modulating the relative phase of the signal photon relative to its entangled idler counterpart. Such operation may be performed by separating the signal and idler photons on the basis of wavelength using a wavelength division multiplexer, passing the stream of signal photons through a phase modulator while passing the idler photons through a suitable delay line to ensure the path lengths of the signal stream and the idler stream remain the same. Thus the signal and idler pairs carry a quantum signal expressed as a relative phase difference between the signal and idler photon pairs.

Hybrid Classical-Quantum Communication Channel

The classical channel output from the classical modulator 18 and the quantum channel output from the encoder 26 are combined by combiner 28, which multiplexes the classical channel (1560 nm) with the quantum channel (signal and idler photons being spectrally adjacent the 1560 nm wavelength as illustrated in FIG. 2). A wavelength division multiplexer may be used for this purpose. In this way the combined classical and quantum signals are propagated through the communication channel 30 which couples the transmitter 10 with the receiver 12. Channel 30 may be implemented by free space propagation or by a suitable waveguide capable supporting guided optical waves at 1560 nm and the nearby adjacent signal and idler wavelengths.

Receiver

The receiver 12 is provided with an input optical signal feed via channel 30 which carries the spectrally multiplexed classical and quantum signals. This input signal is fed to splitter 32 which demultiplexes or separates the classical signal from the quantum signal on the basis of wavelength. A wavelength division multiplexer may be used for this purpose. From the splitter 32, the classical channel is fed through optical signal path 34, while the quantum channel is fed through optical signal path 38.

Classical channel: The classical signal path 34 directly feeds the classical receiver 36, which demodulates the classical signal in conventional fashion. As illustrated, a portion of the classical signal is split off into path 44 for use in extracting the fundamental wavelength (carrier wavelength) of the classical channel so that it can be used in demodulating the quantum channel as will be explained.

Quantum channel: The quantum signal on signal path 38 is fed to port 1 of circulator 40, which routes that signal for output through port 2. Port 2 of circulator 40 is coupled to the signal side of the optical parametric amplifier (OPA) 42. The optical parametric amplifier boosts the signal intensity of the signal and idler photons through an optical parametric amplification process.

To provide energy needed to support the OPA process, the split-off signal from the classical channel via path 44 is used as an injection seed. First the received classical signal (carrying its energy at the 1560 nm wavelength) is fed to the receive optical injection lock circuit 46. Described more fully in connection with FIG. 3 below, the optical injection lock (OIL) circuit employs a master external seeding laser to influence a slave laser, effectively forcing the slave laser to synchronize with the master. Essentially the OIL circuit 46 produces a 1560 nm optical energy that is in synchronism with the 1560 nm classical carrier signal.

Figure 3:
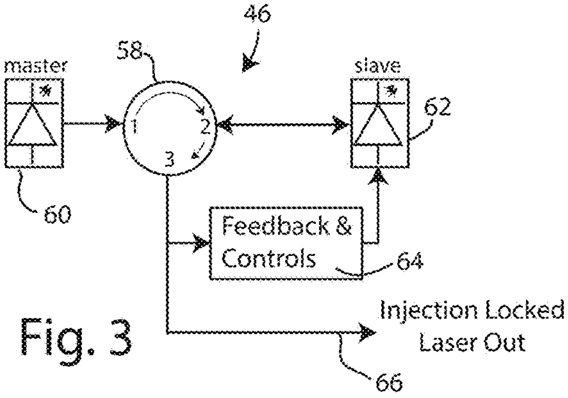
FIG. 3 is a block diagram of the optical injection locking component used in the hybrid quantum-classical system of FIG. 1.

Referring to FIG. 3, the optical lock injection (OIL) circuit 46 is shown in greater detail. The circuit comprises a circulator 58 and two sources of optical energy, depicted here as master laser source 60 and slave laser source 62.

The OIL process works by injecting optical energy from the master source (e.g. master laser source 60) into port 1 of circulator 58. In the receiver circuit of FIG. 1, the master source is the 1560 nm wavelength signal split off from the classical channel. Energy from a free running slave laser source 62 is supplied at port 2 of circulator 58. The slave laser source is nominally close to the wavelength of the master, such that the presence of the master wavelength forces the slave laser to match, effectively locking the slave to the master wavelength by virtue of the feedback and controls channel 64 which adjusts the wavelength of the slave laser. The output of the OIL circuit 46 is supplied at port 66 (taken from port 3 of the circulator 58.

Optical Parametric Amplifier

The output of the OIL circuit 46 is fed through EDFA 48 and SHG 50 (both devices functioning as described in the receiver above) to deliver higher energy 780 nm optical energy into the pump side of the optical parametric amplifier (OPA) 42. The OPA output is fed into port 2 of circulator 40, which routes that signal to the 1560 nm filter 52. The filter's primary purpose is to filter out energy at the 780 nm wavelength. While in the disclosed system, the reflective coatings on the DP-OPA provide this function, the filter may also be a WDM for detection of the individual quantum channels.

The filtered output is then fed to the photodetector 54 which responds to the signal intensities of the combined streams of signal and idler pairs. The quantum-encoded signal can be detected using both signal and idler pairs, or using only one of the pair The OPA amplifies or de-amplifies the signal and idler photon stream depending on the relative phase difference, leading to an effective amplitude modulation. This amplitude modulated signal is then demodulated at 56 to produce an electrical signal carrying the message encoded upon the quantum channel at the transmitter encoder input 26*a*.

Physics of Optical Parametric Amplification (OPA)

In linear optical materials, the polarization induced by light propagating in the medium is proportional to the electric field. The electric field of a beam of photons propagating through a medium produces polarization by spatially deforming the charge distribution in the outer shell of electrons. The relationship between the polarization and the electric field is the susceptibility. The polarization of the charge distribution is opposed by a restoring force of each atom.

The first order susceptibility represents the linear response of the medium to the electric field.

$$P = \varepsilon_0 x_1 \cdot E$$

where the linear optical susceptibility $x_1$ and the corresponding linear dielectric constant $\varepsilon_1 = \varepsilon_0 (1+x_1)$ are field independent constants of the medium.

However, some materials, such as Lithium Niobate crystal, do not behave linearly when exposed to high intensity light as produced by lasers. When such materials are exposed to high intensity illumination, the susceptibility and dielectric constants cease to be linear and thus develop higher order non-linear terms. These nonlinear terms can be expressed by expanding into a Taylor series:

$$X(E) = X_1 + X_2 \cdot E + X_3 + \ldots$$

Of interest here is the second-order nonlinearity. When the second-order nonlinearity condition is present in the material, optical parametric amplification can occur. Optical parametric amplification involves the non-linear interaction of three rays (photon beams), where $\omega_3 = \omega_1 + \omega_2$.

Benefits and Use Cases

A key advantage of the disclosed communication system is the inherent enhanced security provided by the properties of entangled photons. In contrast with other quantum systems, both signal and idler pairs of entangled photons are propagated through the communication channel, which channel also carries the classical signal. By using both signal and idler pairs to carry the quantum message, fragile quantum memories are avoided. The quantum signal will typically have a lower data rate than the classical signal, but the co-propagation of signal and idler pairs is nevertheless robust.

In this way the hybrid system provides a high data rate of the classical signal which can be enjoyed in conjunction with the lower data rate of the quantum signal. In one use case the quantum signal may be used to carry security-related information, such as encryption-decryption keys, source identification information, message routing information and channel integrity measure such as checksums, hash values and the like.

Another advantage of the disclosed hybrid system is its integration of the classical and quantum signals. The entangled photons used by the quantum signals are generated in the transmitter using energy from the classical transmit laser, thus synchronizing the quantum stream's wavelength with the classical transmitter's wavelength. This synchronization between classical and quantum channels is reinforced in the receiver by using the received classical signal energy to derive the energy used to amplify the quantum photon stream. Optical injection locking is used for this purpose.

The quantum circuits in both transmitter and receiver circuits employ a quantum energy boosting process, through second harmonic generation, to produce photons having twice the energy (half the wavelength) of the classical carrier (i.e., classical transmit laser). These higher energy photons are then used to create entangled photons (in the transmitter) and to amplify the entangled photons (in the receiver). Thus the higher energy photons supply pump energy for the spontaneous parametric down conversion (SPDC) in the quantum transmitter. Similarly, the higher energy photons supply pump energy for optical parametric amplification (OPA) of the signal and idler photons in the quantum receiver. Notably, both the SPDC and OPA processes generate output photons nominally at the (lower) energy of the classical carrier. In this way the quantum entangled pair generation in the transmitter and the quantum pair amplification in the receiver produce photon streams which nominally match the classical stream wavelength.

The term "nominally" is used here because, as illustrated in FIG. 2, the wavelengths of the quantum signal and idler pairs are slightly longer and shorter than the classical carrier wavelength. This slight wavelength separation allows the classical signal and the quantum signal and idler signals to be spectrally separated from each other.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment as contemplated herein. Various changes may be made in the function and arrangement of elements described in an exemplary embodiment.

The invention claimed is:

1. A hybrid quantum-classical communication system comprising:

a classical channel having:

a transmit laser producing light of first wavelength; and a classical modulator producing a classical signal of the first wavelength;

a quantum channel having:

a first nonlinear medium coupled to receive light from the transmit laser and producing a first stream of photons of a wavelength approximately half that of the first wavelength;

a second nonlinear medium receptive of the first stream of photons from the first nonlinear medium and producing through spontaneous parametric down conversion a second stream of quantum entangled signal and idler photon pairs;

an encoder receptive of the second stream of quantum entangled signal and idler photon pairs that places a quantum message on the signal and idler photon pairs to define a quantum signal at a signal wavelength and an idler wavelength;

a combiner receptive of the classical signal and the quantum signal that combines the classical and quantum signals into a propagated hybrid signal that occupies an optical spectrum that covers the first wavelength of the classical signal and the signal and idler wavelengths of the quantum signal, wherein the signal and idler wavelengths are centered around the first wavelength within the optical spectrum;

a receiver input receptive of the propagated hybrid signal;

a splitter coupled to the receiver input that splits the propagated signal on the basis of wavelength into a classical channel and a quantum channel;

a classical receiver coupled to the classical channel that demodulates the classical signal to extract a classical message;

a quantum receiver coupled to the quantum channel for extracting a quantum message from the quantum signal;

the quantum receiver having an optical parametric amplifier that boosts the intensity of the quantum signal by increasing the number of signal and idler photons to produce an amplified stream of signal and idler photons;

the optical parametric amplifier being supplied with optical energy to support optical parametric amplification from a second harmonic generation device receptive of the optical energy synchronized to the first wavelength; and a photodetector coupled to receive the amplified stream of signal and idler photons and to produce an electrical signal supplied to a demodulator that extracts a quantum message from the quantum signal.

2. The communication system of claim 1 further comprising an optical injection locking device receptive of the classical signal and supplying the optical energy synchronized to the first wavelength.

3. The communication system of claim 1 further comprising a circulator coupled at a first port to the splitter, and coupled at a second port to the optical parametric amplifier, the circulator having a third port which supplies the amplified stream of signal and idler photons to the photodetector.

4. The communication system of claim 3 further comprising an optical filter interposed between the third port of the circulator and the photodetector.

5. The communication system of claim 1, further comprising an optical injection lock circuit receptive of the classical signal and supplying the optical energy synchronized to the first wavelength.

6. A transmitter for a hybrid quantum-classical communication system, comprising:

a transmit laser producing light of a first wavelength;

a classical modulator coupled to receive light from the transmit laser and producing a classical signal of the first wavelength;

a first nonlinear medium coupled to receive light from the transmit laser and producing a first stream of photons of a second wavelength that is approximately half that of the first wavelength;

a second nonlinear medium receptive of the first stream of photons from the first nonlinear medium and producing through spontaneous parametric down conversion a second stream of quantum entangled signal and idler photon pairs;

an encoder receptive of the second stream of quantum entangled signal and idler photon pairs that places a quantum message on the signal and idler photon pairs to define a quantum signal at a signal wavelength and an idler wavelength;

a combiner receptive of the classical signal and the quantum signal that combines the classical and quantum signals into a hybrid output signal that occupies an optical spectrum that covers the first wavelength of the classical signal and the signal and idler wavelengths of the quantum signal, wherein the signal and idler wavelengths are centered around the first wavelength within the optical spectrum.

7. The transmitter of claim 6, wherein the signal wavelength and the idler wavelength of the hybrid output are offset on opposite sides of the first wavelength.

8. The transmitter of claim 6, further comprising an optical filter receiving the second stream from the second, non-linear medium, wherein the optical filter passes the photons at the first wavelength and blocks the photons at the second wavelength.

9. The transmitter of claim 6, wherein the first non-linear medium comprises a second harmonic generator having a second order nonlinear crystal.

10. The transmitter of claim 6, wherein the second nonlinear medium comprises a spontaneous parametric down converter having a nonlinear crystal for spontaneously converting the first stream of photons into the second stream of quantum entangled signal and idler photon pairs.

11. The transmitter of claim 6, wherein the encoder is configured to modulate the phase of the signal photons relative to the idler photons in the second stream for expressing the quantum message.

12. The transmitter of claim 11, wherein the encoder comprises:

a wavelength division multiplexer configured to separate the signal photons from the idler photons in the second stream based on their wavelengths;

a phase modulator configured to modulate a phase of the separated signal photons passed therethrough; and a delay line configured to adjust a path length of the separated idler signal photons passed therethrough, wherein the path length for each of the signal and idler photons are equal.

13. The transmitter of claim 6, further comprising an amplifier configured to boost an optical intensity of light received by the first non-linear medium from the transmit laser.

14. A receiver for a hybrid quantum-classical communication system, comprising:

a receiver input receptive of a propagated signal that carries a classical signal at a first wavelength and concurrently conveys a quantum signal carried by signal and idler photon pairs having respective signal and idler wavelengths that are centered around the first wavelength within an optical spectrum;

a splitter coupled to the receiver input that splits the propagated signal on the basis of wavelength into a classical channel for the classical signal and a quantum channel for the quantum channel;

a classical receiver coupled to the classical channel that demodulates the classical signal to extract a classical message;

a quantum receiver coupled to the quantum channel for extracting a quantum message from the quantum signal;

the quantum receiver having an optical parametric amplifier that boosts the intensity of the quantum signal by increasing the number of signal and idler photons to produce an amplified stream of signal and idler photons;

the optical parametric amplifier being supplied with optical energy to support optical parametric amplification from a second harmonic generation device receptive of the optical energy synchronized to the first wavelength; and a photodetector coupled to receive the amplified stream of signal and idler photons and to produce an electrical signal supplied to a demodulator that extracts the quantum message from the quantum signal.

15. The receiver of claim 14 further comprising an optical injection locking device receptive of the classical signal and supplying the optical energy synchronized to the first wavelength.

16. The receiver of claim 14 further comprising a circulator coupled at a first port to the splitter and coupled at a second port to the optical parametric amplifier, the circulator having a third port which supplies the amplified stream of signal and idler photons to the photodetector.

17. The receiver of claim 16 further comprising an optical filter interposed between the third port of the circulator and the photodetector.

18. The receiver of claim 14, further comprising an optical injection lock circuit receptive of the classical signal and supplying the optical energy synchronized to the first wavelength.

19. A method of hybrid quantum-classical communication comprising:

producing a light beam at a nominal wavelength with a transmit laser;

splitting the light beam into a first portion and a second portion;

modulating a classical message in the first portion of the light beam to produce a classical signal at the nominal wavelength;

passing the second portion of the light beam through a first nonlinear medium to producing a first stream of photons at a second wavelength that is shorter than the nominal wavelength;

passing the first stream of photons through a second nonlinear medium to produce a second stream of quantum entangled signal and idler photon pairs;

encoding a quantum message on the signal and idler photon pairs to define a quantum signal having signal photons at a signal wavelength and idler photons at an idler wavelength;

combining the classical signal and the quantum signal into a hybrid output signal that occupies an optical spectrum covering the nominal wavelength of the classical signal and the signal and idler wavelengths of the quantum signal, wherein the signal and idler wavelengths are centered around the nominal wavelength within the optical spectrum; and propagating the hybrid output signal through a communication channel.

20. The method of claim 19, further comprising:

receiving a propagated signal representing the hybrid output signal propagating through the communication channel;

separating the propagated signal within the optical spectrum into the nominal wavelength of the classical signal and the signal and idler wavelengths of the quantum signal;

demodulating the classical signal to extract the classical message;

boosting an intensity of the quantum signal by increasing the number of signal and idler photons to produce an amplified stream of signal and idler photon pairs;

filtering the amplified stream of signal and idler photon pairs to pass photon pairs in the optical spectrum and block photon pairs outside the optical spectrum;

photodetecting at least one of the signal and idler photons passed in the optical spectrum to extract the quantum message from the quantum signal.

* * * * *